(12) United States Patent
Ishikawa et al.

(10) Patent No.: US 8,877,433 B2
(45) Date of Patent: Nov. 4, 2014

(54) METHOD OF MANUFACTURING LIQUID INJECTION HEAD AND EXPOSURE METHOD

(71) Applicant: Canon Kabushiki Kaisha, Tokyo (JP)

(72) Inventors: Tetsushi Ishikawa, Tokyo (JP); Tamaki Sato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 60 days.

(21) Appl. No.: 13/857,337

(22) Filed: Apr. 5, 2013

(65) Prior Publication Data

US 2013/0288183 A1    Oct. 31, 2013

(30) Foreign Application Priority Data

Apr. 25, 2012    (JP) .................................. 2012-099802

(51) Int. Cl.
*B41J 2/16*    (2006.01)
(52) U.S. Cl.
USPC .......................................................... 430/394
(58) Field of Classification Search
None
See application file for complete search history.

(56) References Cited

U.S. PATENT DOCUMENTS

| | | | | |
|---|---|---|---|---|
| 4,869,999 | A * | 9/1989 | Fukuda et al. | 430/311 |
| 5,666,140 | A | 9/1997 | Mitani et al. | |
| 5,896,154 | A | 4/1999 | Mitani et al. | |
| 6,395,456 | B1 * | 5/2002 | Tamada et al. | 430/312 |
| 2002/0042025 | A1 * | 4/2002 | Tokai et al. | 430/321 |
| 2006/0172227 | A1 * | 8/2006 | Shaarawi et al. | 430/311 |
| 2012/0086750 | A1 * | 4/2012 | Hamade | 347/20 |
| 2012/0218350 | A1 * | 8/2012 | Watanabe et al. | 347/40 |

FOREIGN PATENT DOCUMENTS

JP    7-171956 A    7/1995

* cited by examiner

*Primary Examiner* — John A. McPherson
(74) *Attorney, Agent, or Firm* — Fitzpatrick, Cella, Harper & Scinto

(57) ABSTRACT

Provided is a method of manufacturing a liquid injection head, the method including: forming, on a substrate, a negative photosensitive resin layer having a first surface on a side opposite to the substrate and a second surface on the substrate side; carrying out first exposure of the negative photosensitive resin layer; carrying out second exposure of the negative photosensitive resin layer; and forming the ejection orifice by carrying out development after the first exposure and the second exposure in which each of the first surface and the second surface has a portion in which a part of the unexposed portion in the first exposure and a part of the unexposed portion in the second exposure overlap and a portion in which a part of the unexposed portion in the first exposure and a part of the unexposed portion in the second exposure do not overlap.

14 Claims, 8 Drawing Sheets

METHOD OF MANUFACTURING LIQUID INJECTION HEAD AND EXPOSURE METHOD

BACKGROUND OF THE INVENTION

1. Field of the Invention

The present invention relates to a method of manufacturing a liquid injection head and an exposure method.

2. Description of the Related Art

A recording apparatus (ink jet recording apparatus) using an ink jet system is adapted to perform recording by ejecting an ink (recording liquid) droplet from an ejection orifice of a nozzle of a liquid injection head and adhering the ink droplet to a recording medium.

An exemplary structure of the liquid injection head is described in the following. In the liquid injection head, multiple nozzles are provided on a silicon substrate. Electric wiring and ejection energy generating elements for generating energy for ejecting ink are provided on a surface of the silicon substrate. Each of the nozzles includes an ink flow path (liquid flow path) which itself includes a bubble generating chamber for generating a bubble using the ejection energy generating element and a minute ejection orifice for ejecting a liquid droplet. Further, the silicon substrate has an ink supply port provided therein for supplying ink to the ink flow paths, the ink supply port communicating with a front surface and a rear surface of the silicon substrate.

In a liquid injection head having such a structure, ink supplied from the rear surface of the silicon substrate is supplied through the ink supply port to the respective ink flow paths to fill the bubble generating chambers. Ink which fills the bubble generating chamber is ejected in a direction substantially orthogonal to the silicon substrate by a bubble generated by the ejection energy generating element.

Japanese Patent Application Laid-Open No. H07-171956 discloses a recording head formed by linearly connecting two recording heads. In a recording head formed by linearly connecting two recording heads, the dot density on a sheet corresponding to a head connecting portion in which the density of the ejection orifices is low becomes lower than that in other portions on the sheet. Therefore, in Japanese Patent Application Laid-Open No. H07-171956, the ink ejection direction is inclined toward the connecting portion so that the dot density at the connecting portion and the dot density in other portions are the same. In order to incline the ejection direction, the ejection orifices are formed into an inclined shape. Further, Japanese Patent Application Laid-Open No. H07-171956 describes two methods of manufacturing ejection orifices which are inclined at a fixed angle. In the first method, after a thick film resist is applied to a Ni plate, the film resist is subject to oblique exposure to form nozzle cylinders, and then, Ni plating is applied to the nozzle cylinders to manufacture an orifice plate. In the second method, after photosensitive glass is applied, the glass is subject to oblique exposure to manufacture an orifice plate.

SUMMARY OF THE INVENTION

According to an exemplary embodiment of the present invention, there is provided a method of manufacturing a liquid injection head including an ejection orifice having an inclined shape, the method including: forming, on a substrate, a negative photosensitive resin layer having a first surface on a side opposite to the substrate and a second surface on the substrate side; carrying out first exposure of the negative photosensitive resin layer under a condition where an unexposed portion is formed so that a cross sectional area thereof taken along a plane in parallel with a substrate surface becomes larger from the second surface toward the first surface; carrying out second exposure of the negative photosensitive resin layer under a condition where an unexposed portion is formed so that a cross sectional area thereof taken along a plane in parallel with the substrate surface becomes smaller from the second surface toward the first surface; and forming the ejection orifice by carrying out development after the first exposure and the second exposure, in which each of the first surface and the second surface has a portion in which a part of the unexposed portion in the first exposure and a part of the unexposed portion in the second exposure overlap and a portion in which a part of the unexposed portion in the first exposure and a part of the unexposed portion in the second exposure do not overlap.

According to another exemplary embodiment of the present invention, there is provided an exposure method, including: forming, on a substrate, a negative photosensitive resin layer having a first surface on a side opposite to the substrate and a second surface on the substrate side; carrying out first exposure of the negative photosensitive resin layer under a condition where an unexposed portion is formed so that a cross sectional area thereof taken along a plane in parallel with a substrate surface becomes larger from the second surface toward the first surface; carrying out second exposure of the negative photosensitive resin layer under a condition where an unexposed portion is formed so that a cross sectional area thereof taken along a plane in parallel with the substrate surface becomes smaller from the second surface toward the first surface; and forming an inclined opening by carrying out development after the first exposure and the second exposure, in which each of the first surface and the second surface has a portion in which a part of the unexposed portion in the first exposure and a part of the unexposed portion in the second exposure overlap and a portion in which a part of the unexposed portion in the first exposure and a part of the unexposed portion in the second exposure do not overlap.

Further features of the present invention will become apparent from the following description of exemplary embodiments with reference to the attached drawings.

DESCRIPTION OF THE EMBODIMENTS

As described above, in Japanese Patent Application Laid-Open No. H07-171956, both in the case of the first method and in the case of the second method, in order to form the inclined ejection orifice, it is necessary to carry out oblique exposure. When the oblique exposure is carried out, optical-path difference occurs within the substrate surface, and thus, the illumination distribution is not uniform within the surface, and the uniformity of the shape of the ejection orifice in the substrate surface may be lowered. Therefore, in this case, the ejection orifice formed by the oblique exposure may vary to a large extent in the inclination angle and the shape to effect the dot density and the ejection amount.

Accordingly, an object of the present invention is to provide a method of manufacturing a liquid injection head which can form an inclined ejection orifice with accuracy.

An embodiment of the present invention is now described in the following, but the present invention is not limited thereto. Note that, a liquid injection head obtained by the present invention can be mounted on an apparatus such as a printer, a copying machine, a facsimile machine, or a word processor having a printer unit, or an industrial recording apparatus combined with a processor of various kinds. The liquid injection head obtained by the present invention can also be used in, for example, an apparatus for manufacturing a biochip, for printing an electronic circuit, or for spraying a drug.

Figure 1:
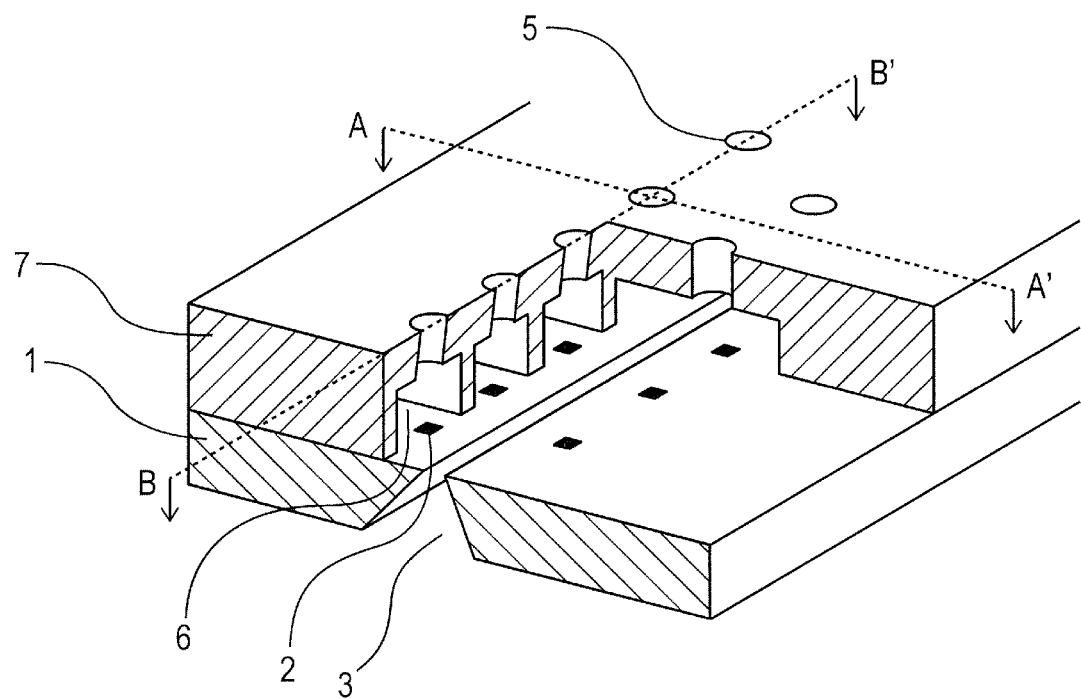
FIG. 1 is a schematic perspective view illustrating an exemplary structure of a liquid injection head obtained by a manufacturing method according to the present invention.

FIG. 1 is a schematic perspective view illustrating an exemplary structure of the liquid injection head obtained by a manufacturing method of this embodiment.

In FIG. 1, the liquid injection head includes a substrate 1 in which energy generating elements 2 for generating energy used for ejecting liquid such as ink are formed at a predetermined pitch. A supply port 3 for supplying liquid is provided in the substrate 1 between two lines of the energy generating elements 2. Ejection orifices 5 which are open above the energy generating elements 2, and ink flow paths 6 which communicate with the supply port 3 and the respective ejection orifices 5 are formed above the substrate 1.

A flow path forming member 7 forms the walls of the ink flow paths 6 which communicate with the supply port 3 and the respective ejection orifices 5 and the walls of the ejection orifices 5. In the embodiment illustrated in FIG. 1, the flow path wall member and the ejection orifice member are integrally formed, but the flow path forming member 7 may include a flow path wall member for forming the walls of the ink flow paths 6 and an ejection orifice member for forming the walls of the ejection orifices 5. Further, the ejection orifices 5 are inclined with respect to a direction perpendicular to the substrate surface, and, both side walls of an ejection orifice are inclined to the same side with respect to the direction perpendicular to the substrate surface in the cross section of the ejection orifice taken along a plane which passes through the center of an upper opening and the center of a lower opening of the ejection orifice and which is perpendicular to the substrate surface.

The method of manufacturing a liquid injection head according to the embodiment of the present invention includes the following steps.

Step 1: a step of forming, on the substrate, a negative photosensitive resin layer having a first surface on a side opposite to the substrate (also referred to as front surface) and a second surface on the substrate side (also referred to as rear surface).

Step 2: a step of carrying out first exposure of the negative photosensitive resin layer under a condition where an unexposed portion is formed so that the cross sectional area thereof taken along a plane in parallel with the substrate surface becomes larger from the second surface toward the first surface.

Step 3: a step of carrying out second exposure of the negative photosensitive resin layer under a condition where an unexposed portion is formed so that the cross sectional area thereof taken along a plane in parallel with the substrate surface becomes smaller from the second surface toward the first surface.

Step 4: a step of forming the ejection orifice by carrying out development after the first exposure and the second exposure.

Figure 4A:
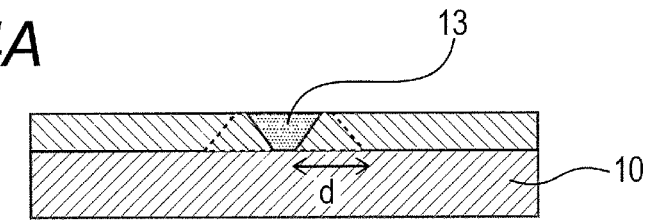
FIGS. 4A, 4B, and 4C are schematic cross-sectional views illustrating comparative examples of an exposure method according to the embodiment of the present invention.
Figure 4B:
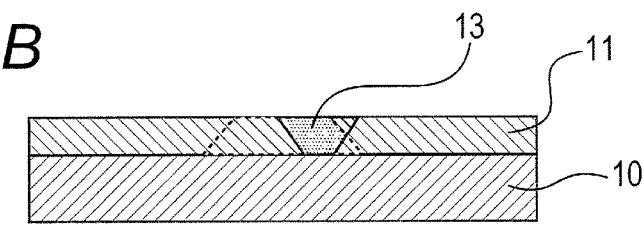

The first exposure and the second exposure are carried out so that each of the first surface and the second surface of the negative photosensitive resin layer has a portion in which a part of the unexposed portion in the first exposure and a part of the unexposed portion in the second exposure overlap and a portion in which a part of the unexposed portion in the first exposure and a part of the unexposed portion in the second exposure do not overlap (see FIG. 4B). In other words, each of the first surface and the second surface of the negative photosensitive resin layer has a portion in which a part of the unexposed portion in the first exposure and a part of the unexposed portion in the second exposure overlap and a portion in which a part of the unexposed portion in the first exposure and a part of the unexposed portion in the second exposure do not overlap. By exposing the negative photosensitive resin layer in this way, an inclined ejection orifice can be formed.

Note that, the order of the first exposure (Step 2) and the second exposure (Step 3) is irrelevant to the present invention, and either of the two may be carried out first.

According to the present invention, it is not necessary to incline a light source or a substrate stage, and thus, no optical-path difference in the exposure light occurs within the substrate surface. Therefore the illumination distribution is less likely to occur, and an inclined ejection orifice can be formed with the reduced variations in the inclination angle and the shape of the ejection orifice, which effect the dot density and the ejection amount.

An embodiment of the present invention is described in the following, but the present invention is not specifically limited to the embodiment. Further, in the following description, an ink jet recording head is mainly used as an example, and the present invention is not specifically limited to a method of manufacturing an ink jet recording head.

The method of manufacturing a liquid injection head according to this embodiment includes the following steps.

Step 1: a step of forming the negative photosensitive resin layer on a substrate.

Step 2: a step of carrying out image forming exposure (first exposure) of the negative photosensitive resin layer so that the unexposed portion thereof becomes larger from the rear surface side toward the front surface side.

Step 3: a step of carrying out image forming exposure (second exposure) of the negative photosensitive resin layer so that the unexposed portion thereof becomes smaller from the rear surface side toward the front surface side.

Step 4: a step of forming the ejection orifice by carrying out development.

In the following, the steps are described with reference to FIGS. 2A and 2B. Further, formation of the inclined ejection orifice in Steps 2 and 3 is described with reference to FIGS. 3A to 3E. Note that, for the sake of simplicity, a structure in which one negative photosensitive resin layer is formed on a substrate 10 is described.

Figure 2A:
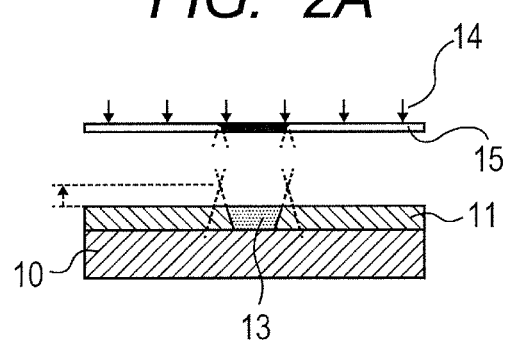
FIGS. 2A and 2B are schematic cross-sectional views illustrating an embodiment of the present invention.

FIG. 2A is a schematic cross-sectional view for illustrating the concept of the first exposure. FIG. 2B is a schematic cross-sectional view for illustrating the concept of the second exposure.

First, the negative photosensitive resin layer is formed on the substrate 10 (Step 1). Then, exposure light 14 is radiated via a mask 15 to the resin layer using an image forming exposure device for reflection projection exposure, one-to-one projection exposure, reduction projection exposure, or the like (image forming exposure) to form a patterned latent image (Steps 2 and 3). A portion in which the exposure light 14 is not blocked by the mask 15 is an exposed portion 11 while a portion in which the exposure light 14 is blocked by the mask 15 is an unexposed portion 13. The unexposed portion both in the first exposure and in the second exposure is removed by a developing process, and the removed portion becomes the ejection orifice (Step 4). If necessary, postbaking may be carried out before the developing process.

In the first exposure, as illustrated in FIG. 2A, the unexposed portion 13 becomes larger from the rear surface side toward the front surface side of the resin layer (hereinafter also referred to as reverse tapered shape). In other words, the unexposed portion in the first exposure is formed so that the cross section thereof taken along a plane in parallel with the substrate surface becomes larger from the rear surface side toward the front surface side of the resin layer (the unexposed portion of the resin layer in cross section at the bottom is smaller than that at the top).

Figure 2B:
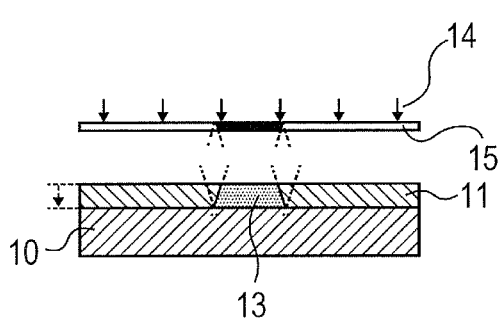

In the second exposure, as illustrated in FIG. 2B, the unexposed portion 13 becomes smaller from the rear surface side toward the front surface side of the resin layer (hereinafter also referred to as tapered shape). In other words, the unexposed portion in the second exposure is formed so that the cross section thereof taken along a plane in parallel with the substrate surface becomes smaller from the rear surface side toward the front surface side of the resin layer (the unexposed portion of the resin layer in cross section at the bottom is larger than that at the top).

Note that, in FIGS. 2A and 2B and FIGS. 3A to 3E, a projection lens system between the mask 15 and the resin layer is omitted.

In Step 2, as illustrated in FIG. 2A, the first exposure is carried out using an image forming exposure device under a condition where the unexposed portion has a reverse tapered shape toward the front surface of the resin layer. In the first exposure, by carrying out the exposure from the front surface side of the resin layer so that an image is formed at a position which is closer to the light source than the front surface of the resin layer (for example, at a position which is closer to the light source than the front surface of the resin layer by more than 0 μm to 30 μm or less), the unexposed portion can be formed into a reverse tapered shape. The image forming position is not specifically limited, but can be, for example, between the front surface of the resin layer and the light source and in a range of 30 μm or less from the front surface of the resin layer.

In Step 3, as illustrated in FIG. 2B, the second exposure is carried out using the image forming exposure device under a condition where the unexposed portion has a tapered shape toward the front surface of the resin layer. In the second exposure, by carrying out the exposure from the front surface side of the resin layer so that an image is formed at a position which is farther from the light source than the front surface of the resin layer (for example, at a position which is farther from the light source than the front surface of the resin layer by more than 0 μm to 30 μm or less), the unexposed portion can be formed into a tapered shape. The image forming position is not specifically limited, but can be, for example, in a range of 30 μm or less from the front surface of the resin layer toward the substrate side.

Further, the inclination angle of the side walls of the unexposed portion can be controlled by the image forming position. Specifically, in Step 2, as the image forming position approaches the mask 15 (the light source) from the front surface of the resin layer, and, in Step 3, as the image forming position approaches the substrate 10 from the front surface of the resin layer, the inclination angle with respect to the direction perpendicular to the substrate surface can be increased. Therefore, the image forming position can be determined in accordance with the desired shape. Further, by increasing the numerical aperture (NA) and the coherence factor (σ) in the exposure in addition to the adjustment of the image forming position, the inclination angle can be adjusted more sensitively. It is preferred that the inclination angle be 20 degrees or less.

Figure 3A:
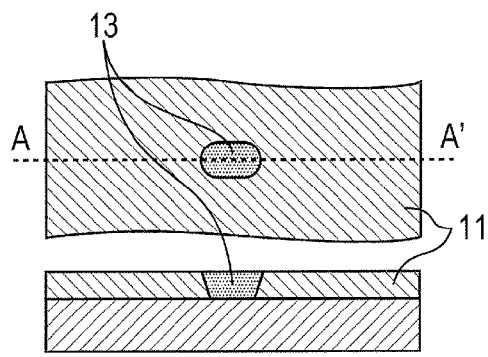
FIGS. 3A and 3B are schematic plan views and schematic cross-sectional views illustrating first exposure and second exposure according to the embodiment of the present invention.
Figure 3B:
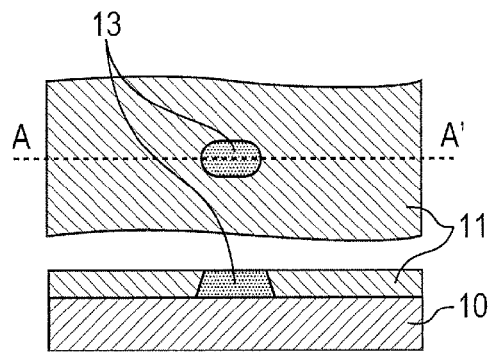

FIGS. 3A and 3B are plan views and cross-sectional views taken along the broken line A-A' of the plan views for illustrating the concept of the first exposure and the second exposure in this embodiment. FIG. 3A illustrates a state after the first exposure in Step 2 (Step 3 has not been carried out), and FIG. 3B illustrates a state after the second exposure in Step 3 (Step 2 has not been carried out).

Figure 3C:
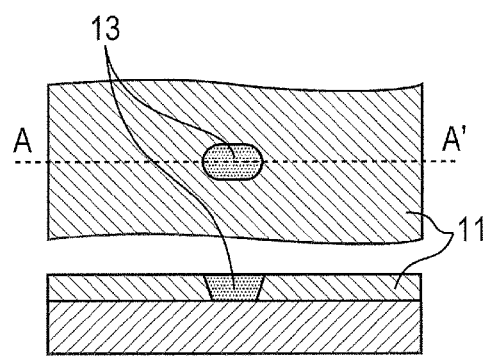
FIGS. 3C, 3D, and 3E are schematic plan views and schematic cross-sectional views illustrating steps of carrying out the first exposure, then carrying out the second exposure, and then forming an ejection orifice according to the embodiment of the present invention.
Figure 3D:
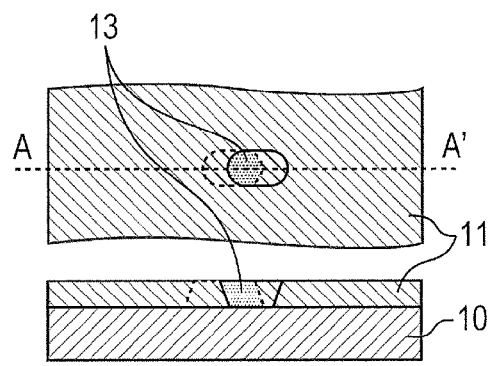
Figure 3E:
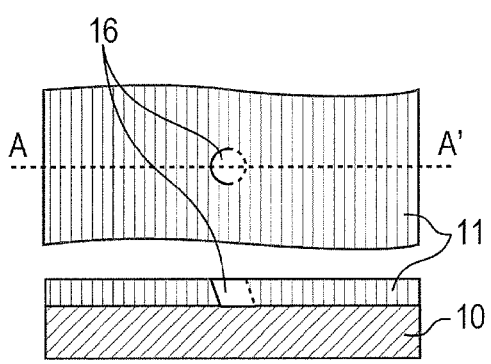

FIGS. 3C to 3E are plan views and cross-sectional views taken along the broken line A-A' of the plan views for illustrating the step of forming the ejection orifice in this embodiment. FIG. 3C illustrates a state after Step 2 is carried out, FIG. 3D illustrates a state after Step 3 is carried out subsequently to the state illustrated in FIG. 3C, and FIG. 3E illustrates a state after Step 4 is carried out subsequently to the state illustrated in FIG. 3D. Note that, in FIGS. 3C to 3E, the contour of the unexposed portion in a reverse tapered shape is shown by solid lines and the contour of the unexposed portion in a tapered shape is shown by broken lines. With reference to FIG. 3D, after Step 2 is carried out, the relative position of the pattern with respect to the substrate is shifted, and then, Step 3 is carried out. For example, the first exposure and the second exposure can be carried out using the same mask. The portion to which light is radiated in the first exposure and in the second exposure (exposed portions) is cured, and the unexposed portion 13 is removed by development as illustrated in FIG. 3E. Space from which the unexposed portion is removed is to be the ejection orifice. Therefore, the inclined ejection orifice includes a surface formed by the first exposure (surface shown by a solid line) and a surface formed by the second exposure (surface shown by a broken line). Note that, in this embodiment, the center of the upper opening or the lower opening of the ejection orifice can be a midpoint of a line segment connecting two points at which the portion formed by the first exposure and the portion formed by the second exposure intersect each other.

Note that, with regard to Step 2 (first exposure) and Step 3 (second exposure), Step 3 (second exposure) may be carried out after Step 2 (first exposure), or Step 2 (first exposure) may be carried out after Step 3 (second exposure), and either of the two may be carried out first.

Next, with regard to a case in which Step 3 is carried out after Step 2, a method of shifting the unexposed region is described.

In order to form the inclined ejection orifice, as illustrated in FIG. 3D, after the first exposure is carried out in Step 2, the unexposed region is slightly shifted and then the second exposure is carried out.

Figure 4C:
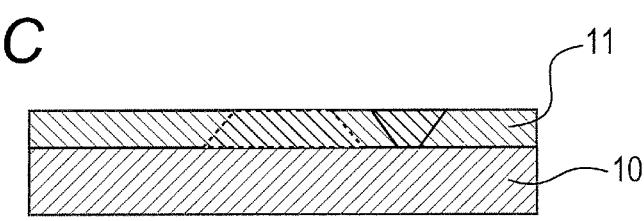

In this case, FIGS. 4A to 4C illustrate three cases in which an inclined ejection orifice is not formed.

FIG. 4A illustrates a state in which, after Step 2 is carried out, Step 3 is carried out under a state in which the substrate and the mask are not moved and only the image forming position is changed. In the method illustrated in FIG. 4A, the center of the unexposed portion in the first exposure and the center of the unexposed portion in the second exposure are the same, and in this case, the ejection orifice is formed into a reverse tapered shape toward the front surface of the resin layer.

FIG. 4B illustrates a state in which, after Step 2 is carried out, the substrate or the mask is moved slightly and then Step 3 is carried out. In FIG. 4B, the unexposed region is slightly shifted, but the amount of the shift is insufficient, and thus, the unexposed region in the resin layer in cross section is not in the shape of a tetragon but a pentagon. As a result, an inclined ejection orifice is not formed.

In FIG. 4C, the amount of the shift is too much, and thus, the unexposed region itself is not formed.

Figure 4D:
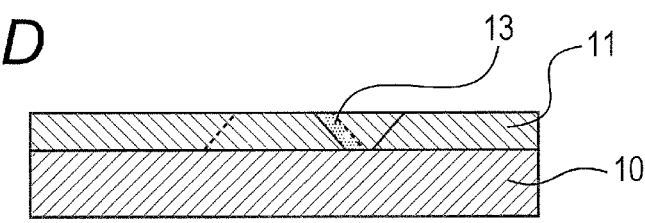
FIG. 4D is a schematic cross-sectional view illustrating an exposure method according to the embodiment of the present invention.

From the above description, in order to form an inclined ejection orifice, as illustrated in FIG. 4D, the first exposure and the second exposure are carried out so that each of the front surface and the rear surface of the negative photosensitive resin layer has a portion in which a part of the unexposed portion in the first exposure and a part of the unexposed portion in the second exposure overlap and a portion in which a part of the unexposed portion in the first exposure and a part of the unexposed portion in the second exposure do not overlap.

Further, in this embodiment, by shifting the substrate stage or the mask by an appropriate amount, multiple ejection orifices which are inclined in the same direction can be formed. For example, by using an exposure device which can change the relative position of the mask with respect to the substrate and using a mask with an oval pattern, multiple ejection orifices which are inclined in the same direction can be formed. In that case, after Step 2 (or Step 3) is carried out, the relative position of the mask with respect to the substrate is shifted by a predetermined amount, and after that, Step 3 (or Step 2) is carried out.

An embodiment according to the present invention is described in the following with reference to FIGS. 5A to 5E (cross-sectional views for illustrating the steps which correspond to the cross-sectional view taken along the broken line B-B' of FIG. 1).

Figure 5A:
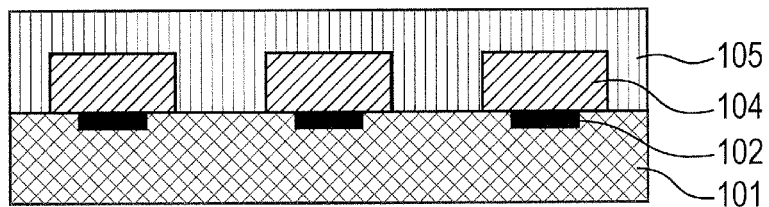
FIGS. 5A, 5B, 5C, 5D, and 5E are schematic cross-sectional views illustrating steps according to an embodiment of the present invention.

In FIG. 5A, flow path molds 104 which are molds for the liquid flow paths are provided on a substrate 101 having energy generating elements 102 on the first surface side (front surface side) thereof. A negative photosensitive resin layer 105 to be the flow path forming member is applied and provided on the substrate 101 and the flow path molds 104.

Figure 5B:
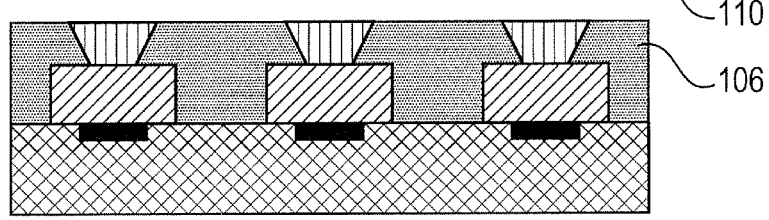

Next, as illustrated in FIG. 5B, the first exposure is carried out under a condition where the unexposed portions have a reverse tapered shape toward the front surface of the resin layer. In FIGS. 5A to 5E, reference numeral 106 denotes the exposed portions (cured portions).

Figure 5C:
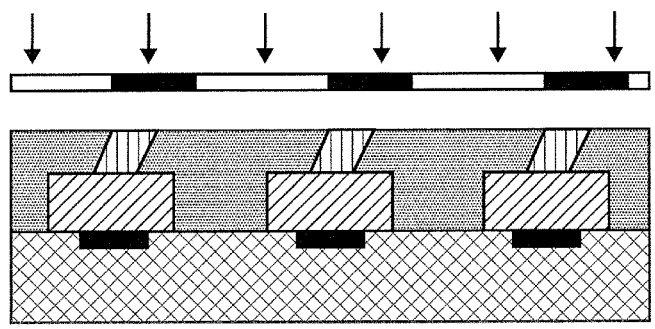

Next, as illustrated in FIG. 5C, after the relative position of a mask 110 with respect to the substrate 101 is shifted (in this case, shifted along the direction of the broken line B-B' of FIG. 1), the second exposure is carried out under a condition where the unexposed portions have a tapered shape toward the front surface of the resin layer. The unexposed portions in the first exposure and in the second exposure are, as illustrated in FIG. 5C, formed into an inclined shape.

Figure 5D:
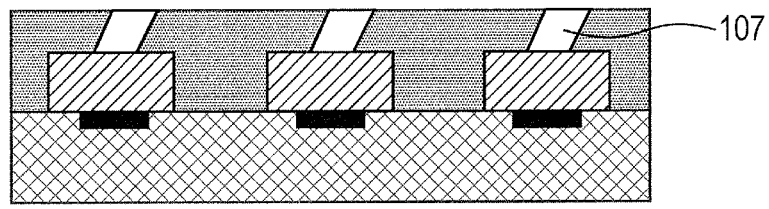

Next, as illustrated in FIG. 5D, inclined ejection orifices 107 are formed by removing the unexposed portions by development.

Figure 5E:
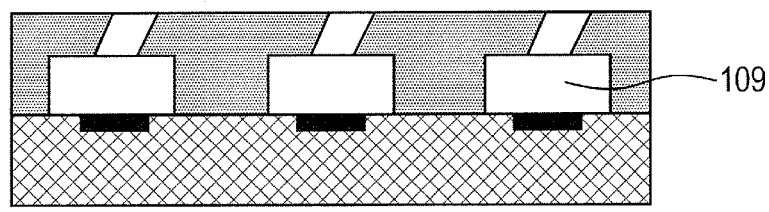

Next, as illustrated in FIG. 5E, liquid flow paths 109 are formed by removing the flow path molds 104.

In the above-mentioned embodiment, the same mask is used in the first exposure and in the second exposure, and by adjusting the shift of the relative position of the mask with respect to the substrate between the first exposure and the second exposure, the inclined ejection orifices are formed. Further, in the embodiment according to the present invention, the first exposure and the second exposure may be carried out using different masks. In such a case, the inclined ejection orifices can also be formed without the necessity for a mechanism for inclining the stage or the light source.

Further, by using multiple masks, ejection orifices which are inclined in various directions can be formed. For example, although the inclination angle of central axes of the ejection orifices with respect to the substrate surface is the same with regard to all the ejection orifices, ejection orifices which are inclined in various directions can be formed. According to this embodiment, multiple ejection orifices having at least two ejection directions (or inclination directions) can be formed.

Figure 6A:
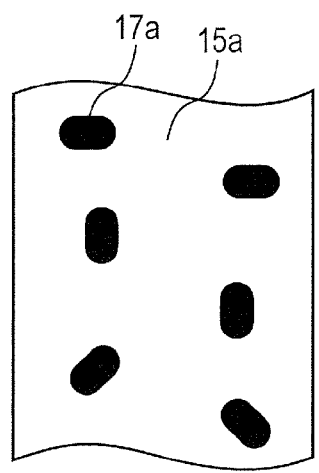
FIGS. 6A, 6B, and 6C are schematic plan views illustrating an embodiment of the present invention.
Figure 6B:
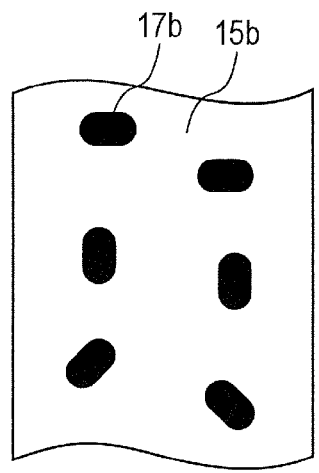
Figure 6C:
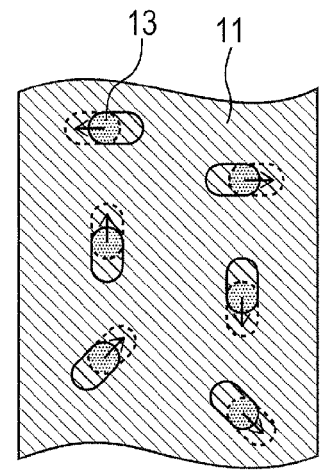

FIG. 6A is a schematic plan view of a first mask 15a which has light-shielding patterns (Cr patterns) 17a formed therein and is used in the first exposure. FIG. 6B is a schematic plan view of a second mask 15b which has light-shielding patterns (Cr patterns) 17b formed therein and is used in the second exposure. FIG. 6C is a schematic plan view illustrating a state after the first exposure and the second exposure are carried out using the first mask 15a and the second mask 15b. In FIG. 6C, broken lines show the contours of the unexposed portions in the first exposure while solid lines show the contours of the unexposed portions in the second exposure.

For example, first, the first mask 15a is used to carry out image forming exposure (first exposure) so that the unexposed portions have a reverse tapered shape toward the front surface of the resin layer. Then, the second mask 15b is used to carry out image forming exposure (second exposure) so that the unexposed portions have a tapered shape toward the front surface of the resin layer. In this way, multiple ejection orifices which are inclined in various directions as illustrated in FIG. 6C can be formed.

Further, each of the first exposure and the second exposure is not limited to exposure which is carried out using only one mask. Each of the first exposure and the second exposure may be carried out using multiple masks. Using multiple masks increases flexibility in the inclination angle and the direction of the ejection orifices. In the following, description is made with reference to FIGS. 7A to 7G.

Figure 7A:
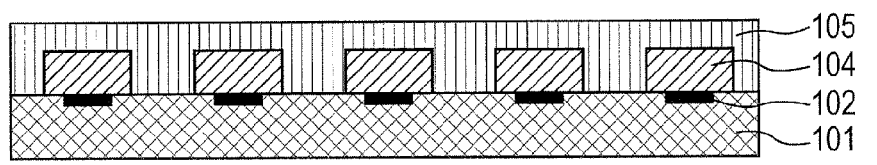
FIGS. 7A, 7B, 7C, 7D, 7E, 7F, and 7G are schematic cross-sectional views illustrating steps according to an embodiment of the present invention.

In FIG. 7A, the flow path molds 104 which are molds for the flow paths are provided on the substrate 101 having the energy generating elements 102 formed on the front surface side thereof. The negative photosensitive resin layer 105 to be the flow path forming member (nozzle member) is formed on the substrate 101 and the flow path molds 104.

Figure 7B:
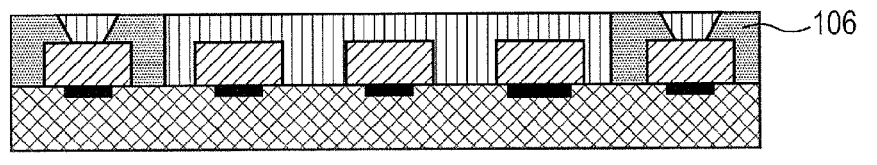

Next, as illustrated in FIG. 7B, using a mask 110a, the first exposure is carried out under a condition where the unexposed portions relating to formation of the ejection orifices have a reverse tapered shape toward the front surface of the resin layer (for example, under an exposure condition where an image is formed at a position which is closer to the light source than the front surface of the resin layer by 20 µm). In the case illustrated in FIGS. 7A to 7G, as illustrated in FIG. 7B, a patterned latent image is formed with regard to the outermost two flow path molds among the illustrated ones.

Figure 7C:
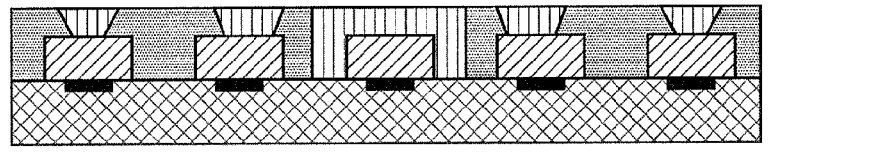

Next, as illustrated in FIG. 7C, using a mask 110b, the first exposure is carried out under a condition where the unexposed portions relating to formation of the ejection orifices have a reverse tapered shape toward the front surface of the resin layer (for example, under an exposure condition where an image is formed at a position which is closer to the light source than the front surface of the resin layer by 10 µm). In the case illustrated in FIGS. 7A to 7G, as illustrated in FIG. 7C, a patterned latent image having an inclination angle of the reverse tapered shape gentler than that illustrated in FIG. 7B is formed with regard to the second outermost two flow path molds.

Figure 7D:
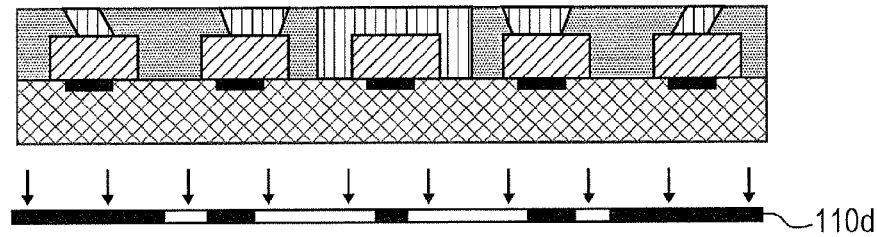

Next, as illustrated in FIG. 7D, using a mask 110c, the second exposure is carried out under a condition where the unexposed portions relating to formation of the ejection orifices have a tapered shape toward the front surface of the resin layer (for example, under an exposure condition where an image is formed at a position which is farther from the light source than the front surface of the resin layer by 20 µm). In the case illustrated in FIGS. 7A to 7G, as illustrated in FIG. 7D, an inclined unexposed portion is formed at the outermost position.

Figure 7E:
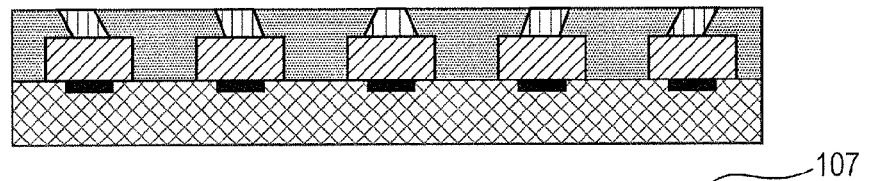

Next, as illustrated in FIG. 7E, using a mask 110d, the second exposure is carried out under a condition where the unexposed portions relating to formation of the ejection orifices have a tapered shape toward the front surface of the resin layer (for example, under an exposure condition where an image is formed at a position which is farther from the light source than the front surface of the resin layer by 10 µm). In the case illustrated in FIGS. 7A to 7G, as illustrated in FIG. 7E, an inclined unexposed portion having an inclination angle gentler than that illustrated in FIG. 7D is formed with regard to the second outermost position. Specifically, when the angle formed by a line connecting the center of the upper opening and the center of the lower opening of an ejection orifice and the direction perpendicular to the substrate surface is regarded as the inclination angle of the ejection orifice, the inclination angle of the ejection orifices formed in the inclined unexposed portions obtained in FIG. 7E is smaller than the inclination angle of the ejection orifices formed in the inclined unexposed portions obtained in FIG. 7D.

Further, in the step illustrated in FIG. 7E, the unexposed portion having a tapered shape is formed with regard to the middle flow path mold.

Figure 7F:
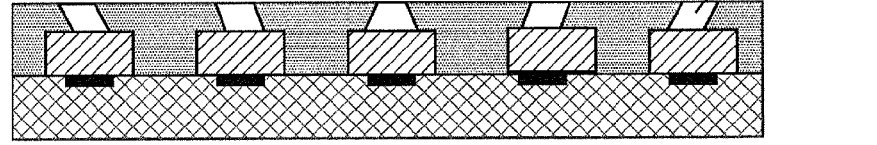

Next, as illustrated in FIG. 7F, the unexposed portions are removed by development.

Figure 7G:
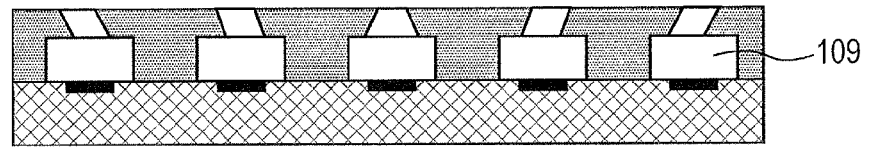

Then, as illustrated in FIG. 7G, the flow path molds 104 are removed to form liquid flow paths 109.

As described above, the inclined ejection orifices can be formed without the necessity for a mechanism for inclining the stage or the light source.

Further, the present invention can also be recognized as an exposure method or a method of forming a fine opening.

EXAMPLE

An example of the present invention is described in the following. In this example, a liquid injection head was manufactured in accordance with steps illustrated in FIGS. 8A to 8H and 9A to 9H. Note that, FIGS. 8A to 8H are cross-sectional views for illustrating the steps which correspond to the cross-sectional view taken along the line A-A' of FIG. 1, and FIGS. 9A to 9H are cross-sectional views for illustrating the steps which correspond to the cross-sectional view taken along the line B-B' of FIG. 1.

Figure 8A:
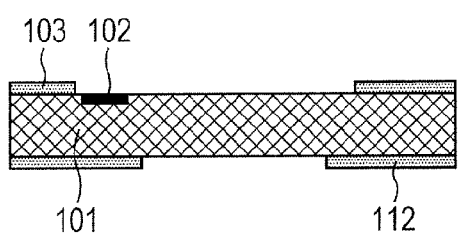
FIGS. 8A, 8B, 8C, 8D, 8E, 8F, 8G, and 8H are schematic cross-sectional views illustrating manufacturing steps according to an example of the present invention.
Figure 9A:
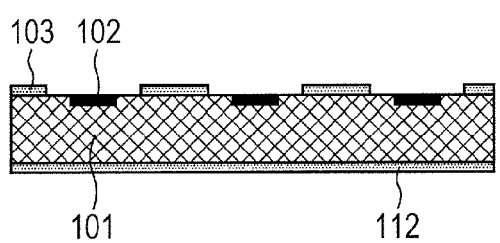
FIGS. 9A, 9B, 9C, 9D, 9E, 9F, 9G, and 9H are schematic cross-sectional views illustrating manufacturing steps according to the example of the present invention.

First, by spin coating, polyetheramide with N-methylpyrrolidone being the solvent was applied at a thickness of 2 µm to both surfaces of the substrate 101 having the ejection energy generating elements 102 and a semiconductor element for driving and controlling the ejection energy generating elements 102 provided thereon. Further, a positive resist was applied to the both surfaces of the substrate at a thickness of 7 µm. Then, using photolithography, a portion of polyetheramide applied on the rear surface of the substrate corresponding to the opening position of the ink supply port was removed by chemical dry etching to form an etching mask 112. After that, the positive resist on the both surfaces was separated. Then, again, a positive resist was applied to the both surfaces of the substrate at a thickness of 7 µm. After that, using photolithography, portions of polyetheramide applied on the front surface of the substrate corresponding to the forming positions of the ink flow paths were removed by chemical dry etching to form an adhesion improving layer 103, and then, the positive resist was separated (FIGS. 8A and 9A).

Figure 8E:
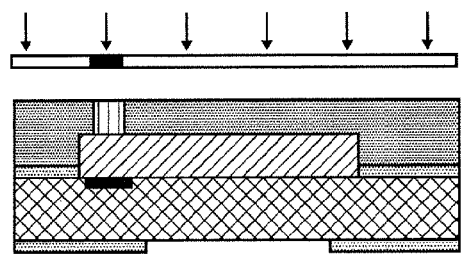
Figure 8B:
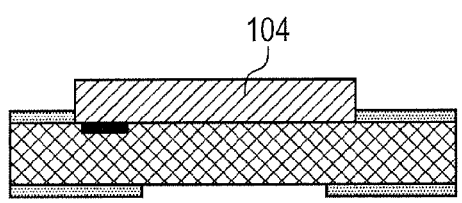
Figure 9B:
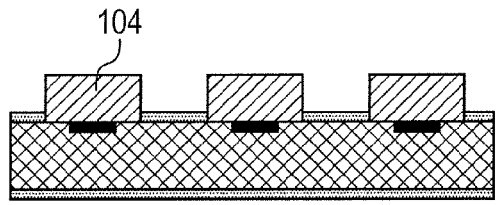

Then, by spin coating, a positive photosensitive resin (ODUR-1010 (manufactured by TOKYO OHKA KOGYO CO., LTD.)) was applied at a thickness of 15 µm to the first surface (front surface) of the substrate and was dried. After that, ultraviolet radiation in the photosensitive wavelength band of the positive photosensitive resin was applied to the positive photosensitive resin via a mask and development was carried out using methyl isobutyl ketone to form the flow path molds for the ink flow paths with the use of the soluble resin (FIGS. 8B and 9B).

Figure 8F:
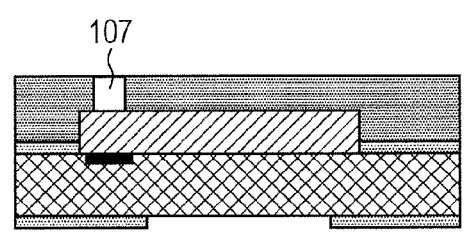
Figure 8C:
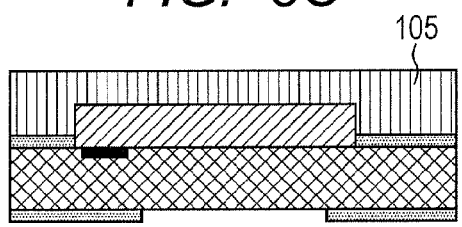
Figure 9C:
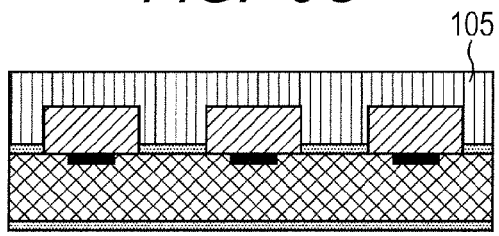

Then, by spin coating, a resin material was applied at a thickness of 20 µm to the flow path molds 104 and was dried to form the negative photosensitive resin layer 105 (FIGS. 8C and 9C). The resin material contains 100 parts by mass of EHPE-3150 (trade name, manufactured by Daicel Corporation), 5 parts by mass of A-187 (trade name, manufactured by Nippon Unicar Company Limited), 2 parts by mass of SP-170 (trade name, manufactured by Asahi Denka Co., Ltd.), and 80 parts by mass of xylene.

Figure 8G:
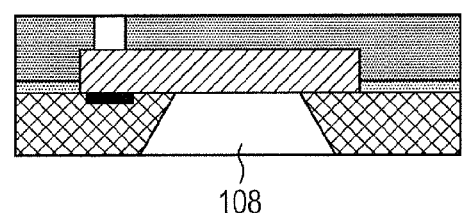
Figure 8D:
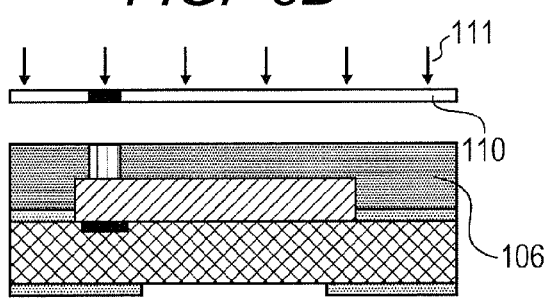
Figure 9D:
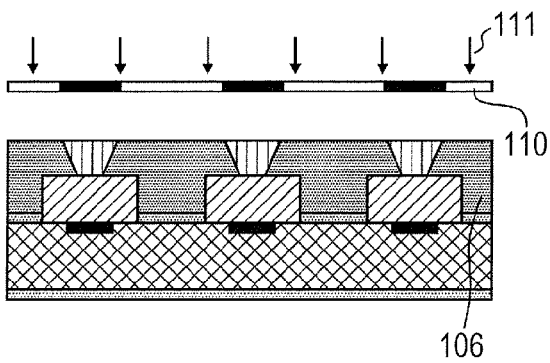

Then, a stepper FPA-3000i5+ (trade name, manufactured by Canon Inc.) was used to carry out the first exposure using ultraviolet radiation so that the unexposed portions had a reverse tapered shape toward the front surface of the resin layer (negative photosensitive resin layer) (FIGS. 8D and 9D).

In the first exposure, as a light-shielding portion of the mask, an oval pattern of 15 µm×20 µm was used. The exposure conditions were as follows: the numerical aperture (NA) was 0.63; the coherence factor ($\sigma$) was 0.65; an image was formed at a position which was 15 µm closer to the mask than the first surface (front surface) of the negative photosensitive resin layer 105; and the exposure amount was 6,000 J/m$^2$.

Figure 9E:
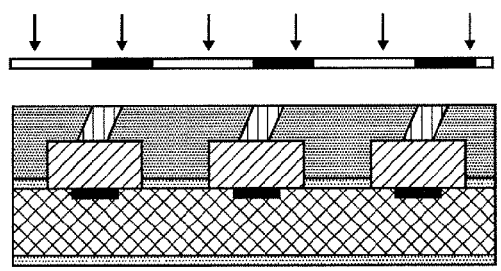

Then, after the relative position of the mask with respect to the substrate was shifted, the second exposure was carried out using ultraviolet radiation so that the unexposed portions have a tapered shape toward the front surface of the resin layer (FIGS. 8E and 9E).

As the method of shifting the relative position, by using, for example, the offset function of a wafer stage of the above-mentioned stepper, the relative position can be shifted with accuracy. The exposure conditions were as follows: the numerical aperture (NA) was 0.63; the coherence factor ($\sigma$)

was 0.65; an image was formed at a position which was 15 μm closer to the substrate than the first surface (front surface) of the negative photosensitive resin layer 105; and the exposure amount was 6,000 J/m².

Figure 9F:
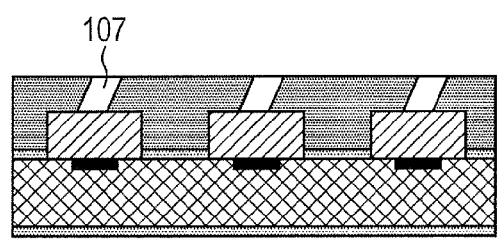

Next, after postbaking was carried out, a mixed liquid of methyl isobutyl ketone and xylene at a ratio of 2:3 was used to carry out development, to thereby remove the unexposed portions to form the flow path forming member having the ejection orifices 107 formed therein (FIGS. 8F and 9F). The diameter of the openings of the ejection orifices 107 was 15 μm. Further, the angle formed by a line connecting the center of the upper opening (opening on the front surface side) and the center of the lower opening (opening on the rear surface side) of an ejection orifice and the direction perpendicular to the substrate surface was 10 degrees.

Figure 9G:
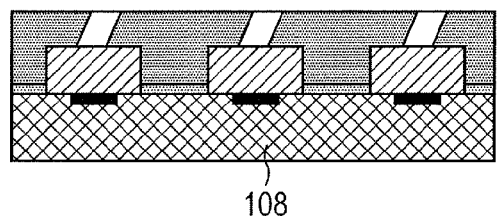

Next, in order to protect the orifice plate, the front surface and the perimeter of the substrate were coated with a rubber resin (not shown), and then, crystal axis anisotropic etching was carried out to form a liquid supply port 108 (FIGS. 8G and 9G). In the crystal anisotropic etching, the etching mask 112 was used as the mask and 22 wt % of tetramethylammonium hydroxide (TMAH) was used as the etchant.

Figure 8H:
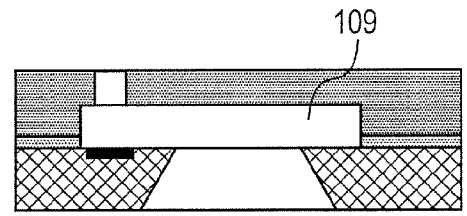
Figure 9H:
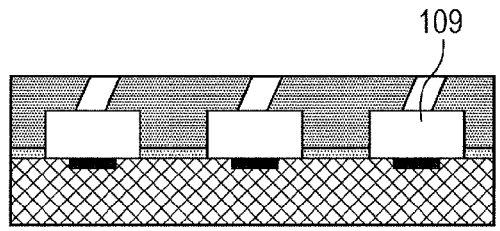

Then, the rubber resin with which the front surface and the perimeter of the substrate were coated was removed by xylene. After ultraviolet radiation in the photosensitive wavelength band of the flow path molds 104 was applied, the flow path molds 104 were removed by methyl lactate to form the liquid flow paths 109. After that, a curing step was carried out at 200° C. for 1 hour (FIGS. 8H and 9H).

Through the steps described above, the liquid injection head was manufactured.

According to the present invention, it is possible to provide the method of manufacturing the liquid injection head which can form the inclined ejection orifice with accuracy.

REFERENCE SIGNS LIST 1 substrate
2 energy generating element
3 supply port
5 ejection orifice
6 ink flow path
7 flow path forming member (nozzle member)
10 substrate
11 exposed portion
13 unexposed portion
14 exposure light
15 mask
16 ejection orifice
17a, 17b light-shielding pattern (Cr pattern)
101 substrate
102 energy generating element
103 adhesion improving layer
104 flow path mold
105 negative photosensitive resin layer (unexposed)
106 exposed portion of negative photosensitive resin layer (cured portion)
107 ejection orifice
108 liquid supply port
109 liquid flow path
110 mask
111 exposure light
112 etching mask While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-099802, filed on Apr. 25, 2012, which is hereby incorporated by reference herein in its entirety.

What is claimed is:

1. A method of manufacturing a liquid injection head including an ejection orifice having an inclined shape, the method comprising:
    forming on a substrate, a negative photosensitive resin layer having a first surface on a side opposite to the substrate and a second surface on the substrate side;
    carrying out first exposure of the negative photosensitive resin layer under a condition where an unexposed portion is formed so that a cross sectional area thereof taken along a plane in parallel with a substrate surface becomes larger from the second surface toward the first surface;
    carrying out second exposure of the negative photosensitive resin layer under a condition where an unexposed portion is formed so that a cross sectional area thereof taken along a plane in parallel with the substrate surface becomes smaller from the second surface toward the first surface; and
    forming the ejection orifice by carrying out development after the first exposure and the second exposure,
    wherein each of the first surface and the second surface has a portion in which a part of the unexposed portion in the first exposure and a part of the unexposed portion in the second exposure overlap and a portion in which a part of the unexposed portion in the first exposure and a part of the unexposed portion in the second exposure do not overlap.

2. The method of manufacturing a liquid injection head according to claim 1, wherein:
    the first exposure and the second exposure are carried out using an image forming exposure device;
    an image forming position in the first exposure is closer to a light source than the first surface; and
    an image forming position in the second exposure is farther from the light source than the first surface.

3. The method of manufacturing a liquid injection head according to claim 1, wherein both side walls of the ejection orifice are inclined to the same side with respect to a direction perpendicular to the substrate surface in a cross section of the ejection orifice taken along a plane which passes through a center of an upper opening of the ejection orifice and a center of a lower opening of the ejection orifice and which is perpendicular to the substrate surface.

4. The method of manufacturing a liquid injection head according to claim 1, wherein the first exposure and the second exposure are carried out using the same mask, and a relative position of the mask with respect to the substrate is adjusted between the first exposure and the second exposure.

5. The method of manufacturing a liquid injection head according to claim 1, wherein the first exposure and the second exposure are carried out using different masks.

6. The method of manufacturing a liquid injection head according to claim 5, wherein the forming the ejection orifice comprises forming a plurality of the ejection orifices having at least two ejection directions.

7. The method of manufacturing a liquid injection head according to claim 1, wherein the first exposure is carried out one of before and after the second exposure.

8. An exposure method, comprising:
forming, on a substrate, a negative photosensitive resin layer having a first surface on a side opposite to the substrate and a second surface on the substrate side;
carrying out first exposure of the negative photosensitive resin layer under a condition where an unexposed portion is formed so that a cross sectional area thereof taken along a plane in parallel with a substrate surface becomes larger from the second surface toward the first surface;
carrying out second exposure of the negative photosensitive resin layer under a condition where an unexposed portion is formed so that a cross sectional area thereof taken along a plane in parallel with the substrate surface becomes smaller from the second surface toward the first surface; and
forming an inclined opening by carrying out development after the first exposure and the second exposure,
wherein each of the first surface and the second surface has a portion in which a part of the unexposed portion in the first exposure and a part of the unexposed portion in the second exposure overlap and a portion in which a part of the unexposed portion in the first exposure and a part of the unexposed portion in the second exposure do not overlap.

9. The exposure method according to claim 8, wherein:
the first exposure and the second exposure are carried out using an image forming exposure device;
an image forming position in the first exposure is closer to a light source than the first surface; and
an image forming position in the second exposure is farther from the light source than the first surface.

10. The exposure method according to claim 8, wherein both side walls of the opening are inclined to the same side with respect to a direction perpendicular to the substrate surface in a cross section of the opening taken along a plane which passes through a center of an upper opening of the opening and a center of a lower opening of the opening and which is perpendicular to the substrate surface.

11. The exposure method according to claim 8, wherein the first exposure and the second exposure are carried out using the same mask, and a relative position of the mask with respect to the substrate is adjusted between the first exposure and the second exposure.

12. The exposure method according to claim 8, wherein the first exposure and the second exposure are carried out using different masks.

13. The exposure method according to claim 12, wherein the forming an inclined opening comprises forming a plurality of the openings having at least two inclination directions.

14. The exposure method according to claim 8, wherein the first exposure is carried out one of before and after the second exposure.

* * * * *